United States Patent

Kawano

[11] Patent Number: 5,976,256
[45] Date of Patent: Nov. 2, 1999

[54] FILM COATING APPARATUS

[75] Inventor: Yukihiro Kawano, Suita, Japan

[73] Assignee: Tokyo Electron Limited, Tokyo, Japan

[21] Appl. No.: 08/979,781

[22] Filed: Nov. 26, 1997

[30] Foreign Application Priority Data

Nov. 27, 1996 [JP] Japan .................................... 8-331663

[51] Int. Cl.[6] ..................................................... B05C 5/00
[52] U.S. Cl. ............................. 118/684; 118/50; 118/407; 118/429
[58] Field of Search .............................. 118/50, 323, 407, 118/409, 416, 429, 684; 427/294, 356

[56] References Cited

U.S. PATENT DOCUMENTS

| 4,675,230 | 6/1987 | Innes . | |
| 4,732,776 | 3/1988 | Boissevain . | |
| 5,209,954 | 5/1993 | Takahashi et al. . | |
| 5,335,681 | 8/1994 | Schmid | 118/50 |
| 5,755,881 | 5/1998 | Fenoglio et al. | 118/50 |

FOREIGN PATENT DOCUMENTS 7-8879  1/1995  Japan .

Primary Examiner—Laura Edwards
Attorney, Agent, or Firm—Oblon, Spivak, McClelland, Maier & Neustadt, P.C.

[57] ABSTRACT

The film coating apparatus comprising a mounting table for holding an LCD substrate substantially horizontally, a nozzle having a slit-form liquid discharge port extending from one end to the other end of the substrate, coating solution supply mechanism for supplying a resist solution to the nozzle, and moving means for moving the nozzle in parallel to the substrate in the direction perpendicular to the longitudinal direction of the liquid discharge port in such a manner that the liquid discharge port keeps a constant clearance with the substrate. The nozzle comprises an entrance for introducing the resist solution from the resist solution supply mechanism, a liquid storage portion communicating with the entrance and the liquid discharge port, for temporarily storing the resist solution introduced through the entrance and sending the coating solution to the liquid discharge port, and film-thickness control means provided on both peripheral regions of the liquid discharge port, for reducing a pressure of the coating solution discharged from the both peripheral regions of the liquid discharge port. The film-thickness control means controls the pressure of the resist solution discharged from the both peripheral regions to be substantially equal to that from the middle region, thereby forming the resist coating film having a uniform thickness on the substrate.

14 Claims, 7 Drawing Sheets

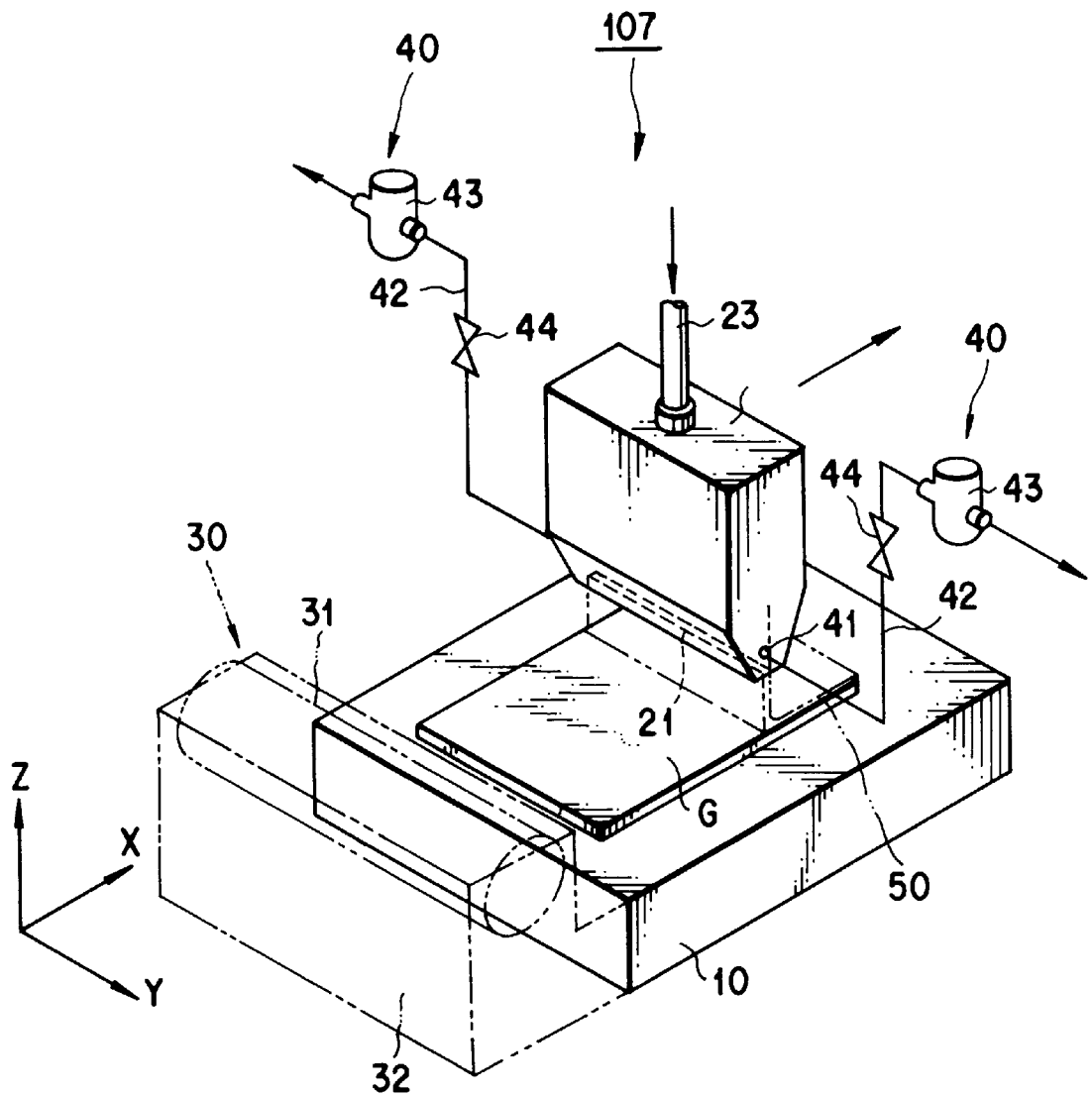
F I G. 4

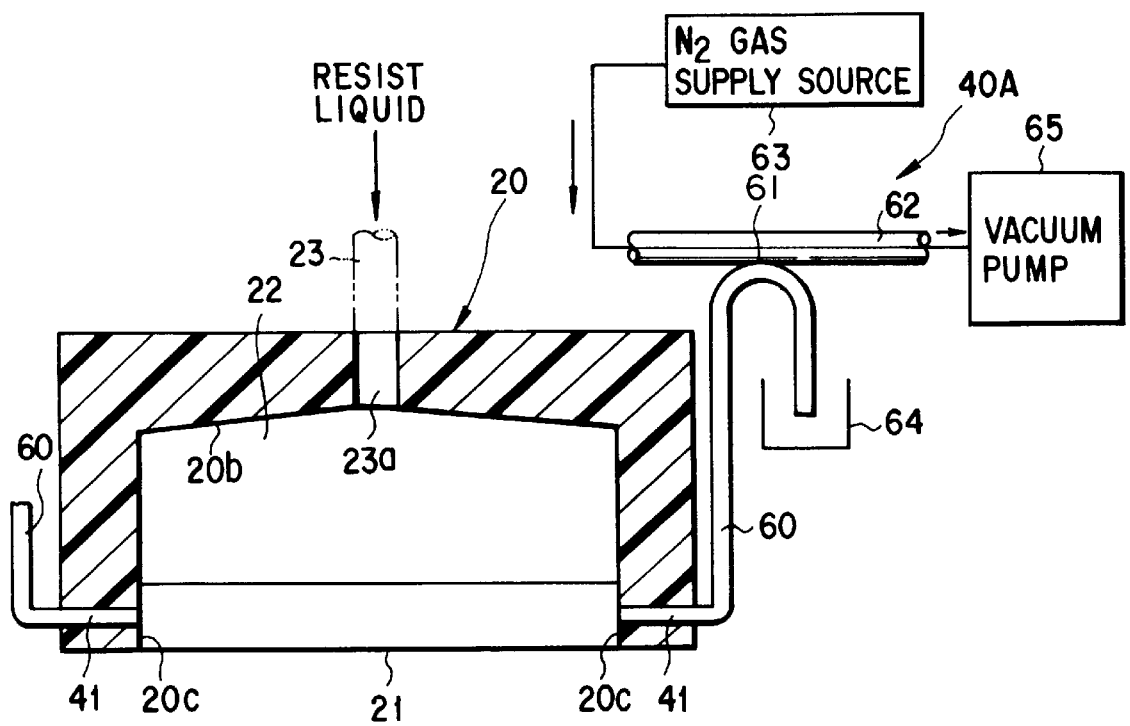
F I G. 10
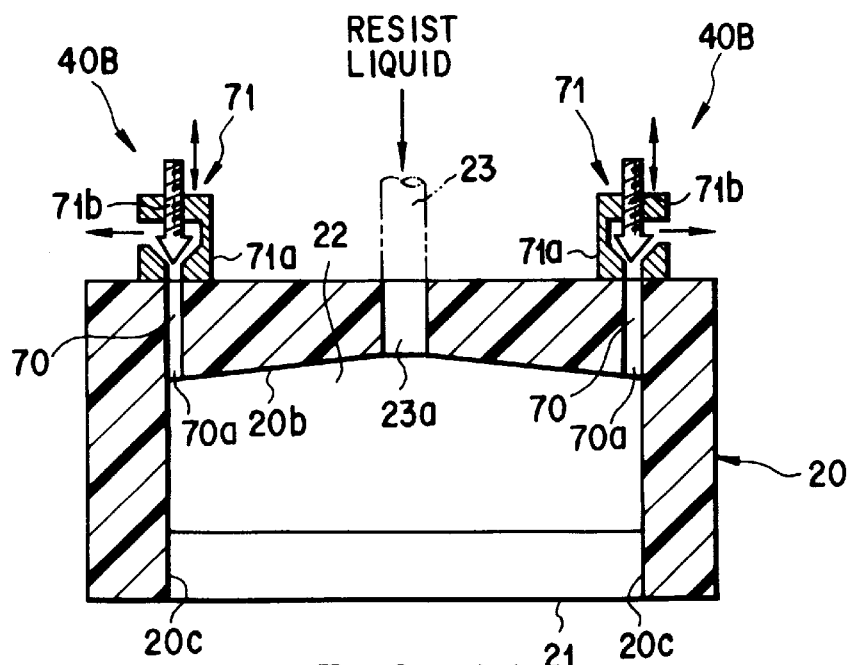
F I G. 11

FILM COATING APPARATUS

BACKGROUND OF THE INVENTION

The present invention relates to a film coating apparatus for coating a resist film on a substrate such as an LCD substrate and a semiconductor substrate.

In liquid crystal display (LCD) manufacturing processes, a photolithography technique is employed. In the photolithographic technique, a resist is first coated on a glass substrate and a predetermined pattern is then formed on the coated resist by exposing the resist to light followed by developing it. In this manner, a resist film having the predetermined pattern is formed on the surface of the glass substrate. If the resist pattern is further subjected to a film formation process and an etching process, a circuit formed of a semiconductor layer, an insulating layer and an electrode layer can be formed on the substrate in a predetermined pattern.

For example, U.S. Ser. No. 08/914,819 (filed on Aug. 20, 1997) discloses a resist coating apparatus for an LCD substrate having a slit nozzle. The conventional apparatus, as shown in FIG. 1, has a nozzle 1 having a linear slit-form discharge port 2. A passage 1a communicates with a resist solution supply source (not shown) and a liquid storage portion 1c of the nozzle 1 through an entrance 1b. The liquid storage portion 1c communicates with a slit-form discharge port 2. While a resist solution 3 is being discharged from the slit nozzle 1 in the form of a band, the nozzle 1 is moved along an LCD substrate from one side to the opposite side in a scanning manner, thereby coating the resist on the substrate.

In the nozzle 1 of the conventional apparatus, however, pressure P2 applied to the peripheral regions of the slit-form discharge port 2 tends to be higher than pressure p1 applied to the middle region thereof, with the result that the amount of the resist solution discharged from the peripheral regions is increased compared to that from the middle region. Consequently, the resist solution discharged from the peripheral regions becomes thicker than that from the middle region, as shown in FIG. 2. Furthermore, since the viscosity of the resist solution is influenced by the variance in discharge pressure of the resist solution, the resist solution discharged from both peripheral regions of the discharge port 2 becomes thick. Consequently, the resist film 4 formed an LCD substrate G is thick at the both lateral sides as shown in FIG. 3. As a whole, the resist film is formed with a non-uniform thickness, with the result that the product yield decreases.

In addition, when the film is formed by coating the resist solution discharged from the nozzle 1 on the LCD substrate, other factors such as ambient temperature and static electricity have effects on the resist film formation. Also for this reason, the resultant resist film becomes non-uniform.

BRIEF SUMMARY OF THE INVENTION

An object of the present invention is to provide a film-coating apparatus capable of forming a film uniform in thickness by controlling an amount of a coating solution to be discharged to be supplied in the form of a uniform band.

The film coating apparatus comprising:

substrate holding means for holding a substrate substantially horizontally;

a nozzle having a slit-form liquid discharge port extending from one end to the other end of the substrate;

coating solution supply means for supplying a coating solution to the nozzle; and moving means for moving the nozzle in parallel to an upper surface of the substrate in the direction perpendicular to the longitudinal direction of the liquid discharge port in such a manner that the liquid discharge port keeps a substantially constant clearance with the substrate, the nozzle comprising:

an inlet port for introducing the coating solution from the coating solution supply means;

a liquid storage portion communicating with both the inlet port and the slit-form liquid discharge port, for temporarily storing the coating solution introduced through the inlet port and sending the coating solution to the slit-form liquid discharge port; and film-thickness control means provided on both peripheral regions of the slit-form liquid discharge port, for reducing a pressure of the coating solution discharged from the both peripheral regions of the slit-form liquid discharge port;

wherein the film-thickness control means controls the pressure of the coating solution discharged from the both peripheral regions of the liquid discharge port to be substantially equal to that from the middle region thereof, thereby forming the coating film with a uniform thickness on the upper surface of the substrate.

In this case, the short side face of the liquid storage portion is defined by a downwardly/outwardly inclined inner wall and a first vertical inner wall. The long side face of the liquid storage portion is defined by a second vertical inner wall, a downwardly/outwardly inclined inner wall, and a third vertical inner wall. Furthermore, the first vertical inner wall defines both peripheral regions of the liquid discharge port.

The film-thickness control means may comprise a plurality of communication paths having an opening in the inner wall of the nozzle which defines the both peripheral regions of the liquid discharge port, a plurality of suction pipes respectively connected to the communication paths, and vacuum pumps for evacuating the suction pipe.

Alternatively, the film-thickness control means may comprise a plurality of communication paths having an opening in the inner wall of the nozzle which defines the both peripheral regions of the liquid discharge port, suction pipes respectively communicating with the communication paths, ejector mechanisms for reducing the pressure of the suction pipe.

It is further desired that the film coating apparatus have dehydration means for volatilizing a solvent contained in the coating solution immediately upon supply from the both peripheral regions of the liquid discharge port, thereby increasing the viscosity of the coating solution.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a schematic perspective view of a film-coating apparatus according to an embodiment of the present invention;

FIG. 10 is a cross-sectional view of a film-coating apparatus according to second embodiment of the present invention, accompanying a block diagram of peripheral devices;

FIG. 11 is a cross-sectional view of a film-coating apparatus according to third embodiment of the present invention;

DETAILED DESCRIPTION OF THE INVENTION

Hereinbelow, preferable embodiments of the present invention will be explained with reference to the accompanying drawings. We will explain the case in which the present invention is applied to an apparatus for coating resist on an LCD glass substrate.

Figure 5:
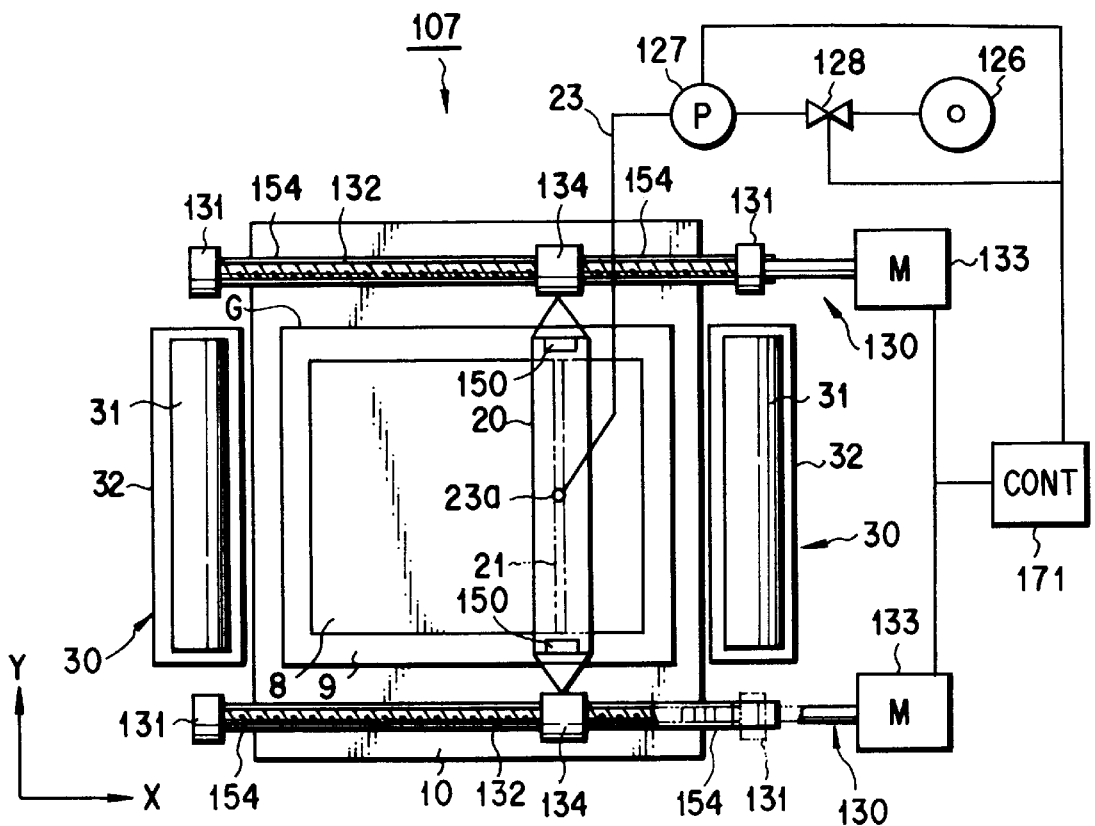
FIG. 5 is a plan view of a film coating apparatus according to an embodiment of the present invention, accompanying a block diagram of peripheral devices.

As shown in FIGS. 4 and 5, a film-coating apparatus 107 comprises a mounting table 10, a slit nozzle 20, and two waiting sections 30. The mounting table 10 has a vacuum adsorption mechanism (not shown) for holding a glass substrate G (650 mm×550 mm) horizontally by adsorption force. The slit nozzle 20 has a slit-form liquid discharge port 21 extending in the Y-axis and is movably supported by a moving mechanism 130 in the X-axis direction. The length of the slit-form liquid discharge port 21 is slightly shorter than that of a short side of the substrate G. This is because the glass substrate G has a non resist-coating region 9 in the periphery of a resist coating region 8.

As shown in FIG. 5, the moving mechanism 130 comprises a pair of ball screws 132, a pair of motors 133, a pair of movable members 134, and a pair of linear guides 154. The pair of ball screws 132 and linear guides 154 extend in parallel to the X-axis. The substrate G is mounted on the mounting table 10 between the pair of linear guides 154. The pair of ball screws 132 are supported by two bearings 131, respectively on the mounting table 10.

The pair of movable members 134 are provided respectively at both ends of the slit nozzle 20. Each of the movable members 134 comprises a ball nut and a nozzle waving mechanism 138 (described later). Each end of the slit nozzle 20 is connected to the ball screw 132 and the linear guide 154 via the movable member 134.

Furthermore, interval maintaining mechanisms 150 are respectively provided at both ends of the slit nozzle 20. The interval maintaining mechanism 150 serves for maintaining a constant interval between the discharge port 21 of the nozzle 20 and a coating surface 8 of the substrate G. As the interval maintaining mechanism 150, a roller moving on the peripheral non-coating region 9 of the substrate G is used in the U.S. Ser. No. 08/914,819.

One end of each of ball screws is connected to a driving axis of a motor 133. The electric circuits of the motors 133 are separately connected to an output portion of a controller 171. The motors 133 are therefore controlled synchronously by the controller 171. In such a moving mechanism 130, when a screw 132 is rotated, the nozzle 20 moves in the X-axis while maintaining a constant distance from the coating surface 8 of the substrate G mounted on the mounting table 10.

Next, a supply route of the resist solution to the slit nozzle 20 will be explained.

As shown in FIG. 5, the resist solution supply route comprises a passage 23, a resist solution supply source 126, diaphragm pump 127, and a valve 128. The slit nozzle 20 has an inlet port 23a in the upper portion thereof. The entrance 23a is connected to the passage 23 of the resist solution supply route. The resist solution is introduced in the nozzle 20 through the entrance 23a. The passage 23 is connected to the resist solution supply source 126 through the diaphragm pump 127 and the valve 128. The passage 23 may be formed of a soft-resin tube or a stainless-steel flexible hose. The operation circuits of the diaphragm pump 127 and the valve 128 are connected to the output portion of the controller 171, thereby controlling an amount of the resist solution to be supplied to the nozzle 20.

Two waiting sections 30 face each other with the mounting table 10 interposed therebetween. The waiting sections 30 are provided close on the sides of the mounting table 10 in parallel to the Y-axis, respectively. A prime roller 31 is provided in the waiting section in order to prevent dehydration of the liquid discharge port 21 at the waiting section (not in operation).

Figure 6:
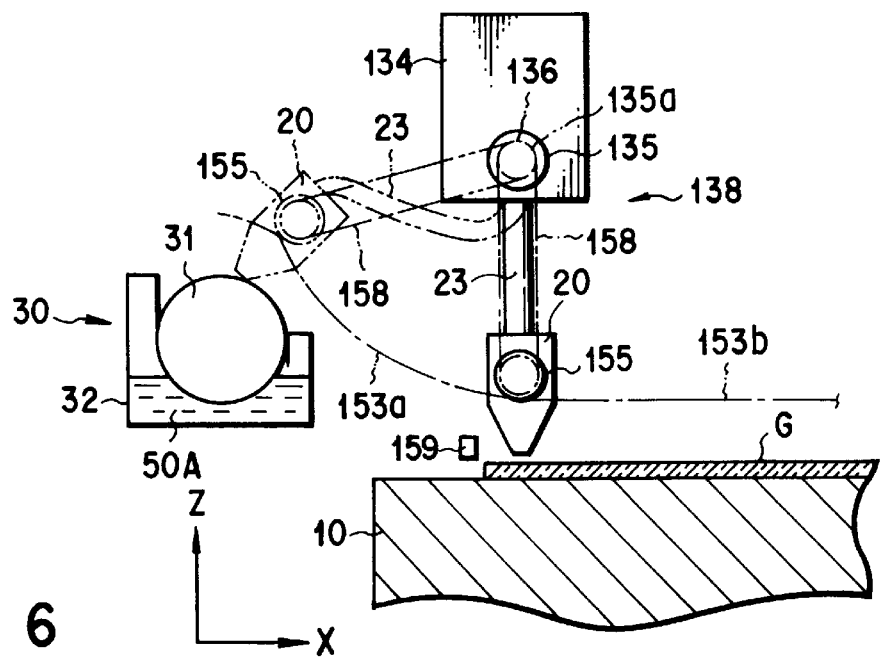
FIG. 6 is a schematic view of a slit nozzle for explaining the initiation of its operation.

As shown in FIG. 6, the prime roller 31 is housed horizontally within a container 32 at the waiting section 30. The lower half portion of the prime roller 31 is dipped in a solvent (thinner) 50A in the container 32. The prime roller 31 is rotatably supported by a rotating mechanism (not shown). When the nozzle 20 stays at the waiting section, the liquid discharge port 21 is in contact with the peripheral surface of the prime roller 31. When the prime roller 31 is rotated, thinner 50A is attached on the peripheral surface of the prime roller 31 and transferred to the liquid discharge port 21 of the nozzle. In this manner, the dehydration of the liquid discharge port 21 is successfully prevented, and thereby a change in concentration of the resist solution present in the liquid discharge port 21 can be suppressed.

The nozzle waving mechanism 138 is provided between the slit nozzle 20 and the movable member 134. The nozzle waving mechanism 138 is a belt-driving mechanism comprising a motor 135, a driving pulley 136, a follower pulley 155, and a belt 158. The motor 135 is provided on a lateral side of the movable member 134 in such a manner that its driving axis 135a is positioned horizontally. A driving pulley 136 is engaged with the driving axis 135a. The follower pulley 155 is provided on a lateral side of the nozzle 20. The belt 158 is stretched from the follower pulley 155 to the driving pulley 136. The outer wheel of the follower pulley 155 is provided freely rotatable. When the outer wheel is in contact with guide rails (153a, 153b) and moves them, the nozzle 20 is guided. The guide rail is formed of a curve portion 153a and a straight portion 153b.

The sensor 159 is provided in the proximity of the coating initiating site. The sensor 159 is responsible for detecting the nozzle 20 present on the coating initiation site. When a nozzle detection signal is input in the controller 171 from the sensor 159, the controller 171 directs the motor 135 of the nozzle waving mechanism 138 to stop its movement and to initiate driving of the X-axis moving mechanism 130.

Now, the slit nozzle 20 will be explained in detail.

Figure 7:
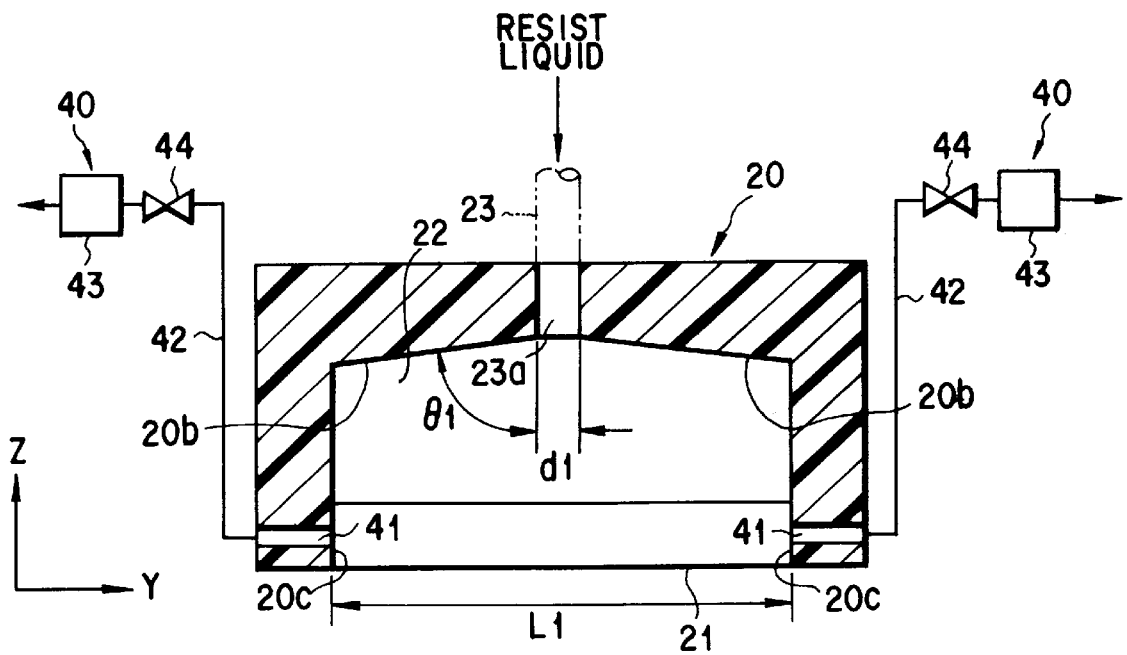
FIG. 7 is a cross sectional view of a film-coating apparatus according to first embodiment of the present invention, accompanying a block diagram of peripheral devices.

As shown in FIG. 7, the slit nozzle 20 comprises a liquid storage portion (header portion) 22 and a liquid discharge port 21. The liquid storage portion 22 is defined by a downwardly/outwardly inclined inner wall 20b, a first vertical inner wall 20c, a second vertical inner wall 20d, a downwardly/inwardly inclined inner wall 20e, and a third vertical inner wall 20f of the nozzle. A short side face of the liquid storage portion 22 is defined by the downwardly/outwardly inclined inner wall 20b and the first vertical inner wall 20c. A longer side face of the liquid storage portion 22 is defined by the second vertical inner wall 20d, the downwardly/inwardly inclined inner wall 20e, and the third vertical inner wall 20f. Note that the first vertical inner wall 20c and the liquid discharge port 21 are contiguously formed. An opening of the communication passage 41 of the film thickness control means 40 is formed in the first vertical inner wall 20c.

At the upper middle position of the liquid storage portion 22, the inlet port 23a is formed. The resist solution supply passage 23 is connected to the liquid storage portion 22 at the inlet port 23a. The liquid discharge port 21 is provided contiguously to the liquid storage portion 22. Note that only one inlet port 23a is connected to the liquid storage portion 22 in the figure, however, a plurality of inlet ports 23a may be connected to the liquid storage portion 22. The nozzle 20 is formed of an ethylene fluoride based resin such as PTFE. Since an air conditioning apparatus (not shown) is provided in the resist solution supply route, the temperature of the resist solution 50 is controlled to fall within an optimum range.

The diameter of the liquid storage portion 22 is gradually widened downwardly since the inner wall 22b becomes widened downwardly and outwardly until it reaches the same size as the Y-axis size L1 of the liquid discharge port 21, at the liquid storage portion 22 sandwiched by the first vertical inner walls 20c.

Figure 13:
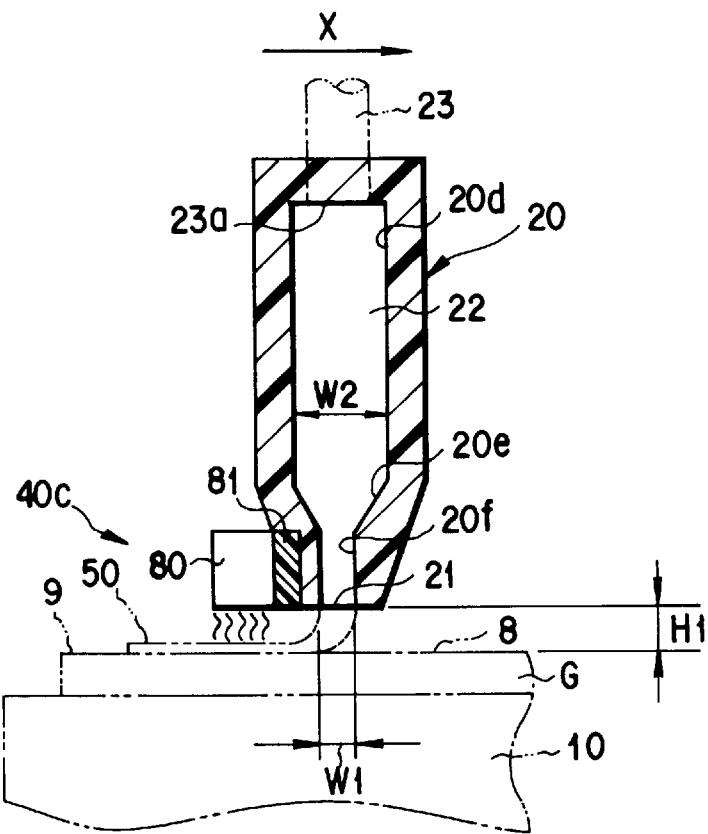
FIG. 13 is a schematic sectional view of the apparatus of fourth embodiment taken in the line XIII—XIII of FIG. 12.

As shown in FIG. 13, the size W2 in the X-axis direction of the liquid storage portion 22 is larger than the size W1 in the X-axis direction of the liquid discharge port 21. The size W2 in the X-axis direction is constant in the liquid storage portion sandwiched by the second vertical inner walls 20d (positioned upward). However, the size W2 of the liquid storage portion 22 is gradually reduced, since the inner wall 20e becomes narrower downwardly/inwardly, until it reaches the same size as the X-axis size W1 of the liquid discharge port 21 at the liquid storage portion 22 sandwiched by the third vertical walls 20f (positioned downward).

To form a coating resist with a uniform film thickness, it is desirable that a clearance H1 between the liquid discharge port 21 and the substrate G be as small as possible. It is preferable that the clearance H1 fall within the range of 100 to 200 $\mu$m. When the resist is coated over a substrate G of 550 mm×650 mm, the sizes of L1, W1, and W2 of the nozzle 20 are desirably 540 mm, 0.10 to 0.15 mm, and 20 mm, respectively.

The diameter $d_1$ of the liquid inlet port 23a is 15±1 mm. The downwardly/outwardly inclined inner wall 20b forms an angle of $\theta_1$ (85°±2°) with the Z-axis.

It should be noted that the scanning speed of the nozzle 20 is 20 mm/second when the viscosity of the resist solution is 5 cp (centipoise) and 35 mm/second when the viscosity of the resist solution is 10 cp (centipoise).

Now, the film-thickness control means will be described.

As shown in FIG. 7, the film thickness control means 40 of a first embodiment comprises a plurality of communication paths 41, suction pipes 42, diaphragm pumps 43 and valves 44. Each of the communication paths 41 passes through the lower side wall portion of the nozzle in the vicinity of the end portion of the nozzle slit in the longitudinal direction. One end opening of the communication path 41 is provided at the liquid discharge port 20c and the other end is connected to the diaphragm pump 43 on the sucking side by way of the suction pipe 42. Note that the valve 44 is interposed between the communication path 41 and the diaphragm pump 43. Both operations of the diaphragm pump 43 and the valve 44 are controlled by the controller 171.

The operation of the aforementioned film-thickness control means will be explained below.

Figure 8:
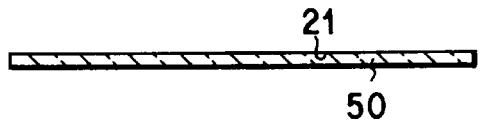
FIG. 8 is a schematic transverse sectional view of a coating film formed by supplying the coating solution from a slit nozzle of the present invention.

When the nozzle 20 is positioned at the waiting section 30, the liquid discharge port 21 of the nozzle 20 is brought in contact with the prime roller 31 to prevent dehydration, while the substrate G is mounted on the mounting table 10 by transfer means (not shown) and held by an adsorption force. Subsequently, the resist solution 50 is supplied from the resist solution supply source 126 to the nozzle 20. At this time, pressure P2 of the resist solution 50 discharged from the peripheral region of the liquid discharge port 21 is reduced by the film-thickness control means 40 to the same value as the pressure P1 of the resist solution 50 discharged from the middle region of the liquid discharge port 21. As a result, the resist solution 50 can be supplied onto the substrate G from the liquid discharge port 21 in the form of a band having a uniform thickness, as shown in FIG. 8. Thereafter, if the nozzle 20 is moved in the X-axis direction, the resist solution is successfully coated on the coating region 8 of the substrate G.

After the resist film is formed on the coating region 8 of the substrate G in this manner, the resist solution supply is terminated and the nozzle 20 is moved back to the waiting section 30. The liquid discharge port 21 is brought in contact with the prime roller 31 and retained in this state until next use. On the other hand, the resist-coated substrate G is unloaded from the mounting table 10 by transfer means (not shown) and transferred to a next process device.

Figure 1:
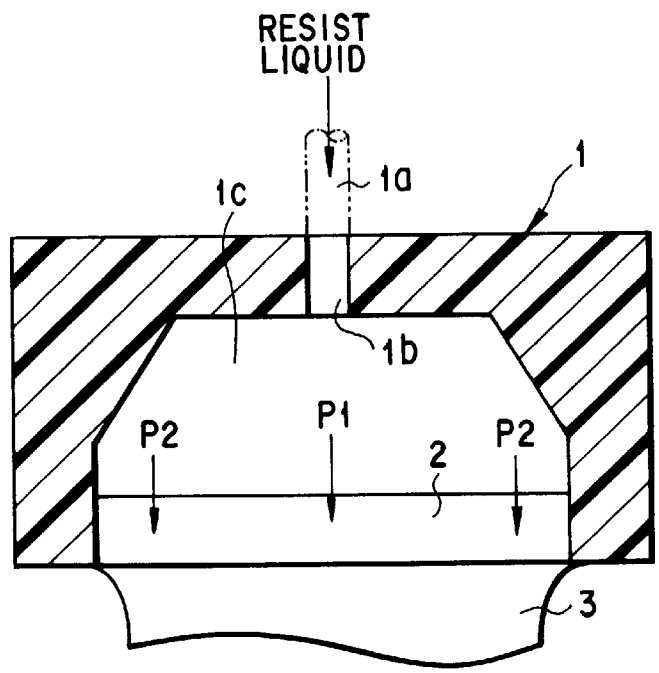
FIG. 1 is a schematic sectional view of a slit nozzle of a conventional apparatus.
Figure 2:
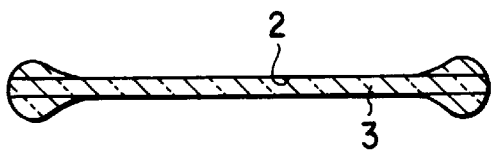
FIG. 2 is a schematic transverse sectional view of a coating film formed by supplying a coating solution from the slit nozzle of a conventional apparatus.
Figure 3:
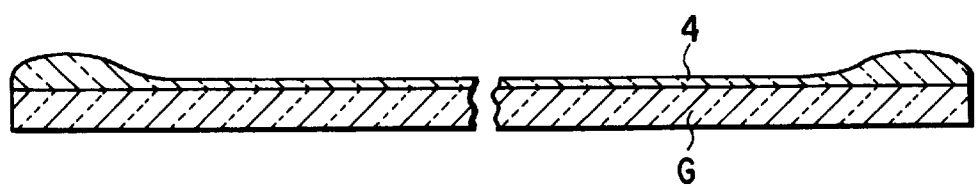
FIG. 3 is a magnified sectional view of a coating film formed by a conventional apparatus.
Figure 9:
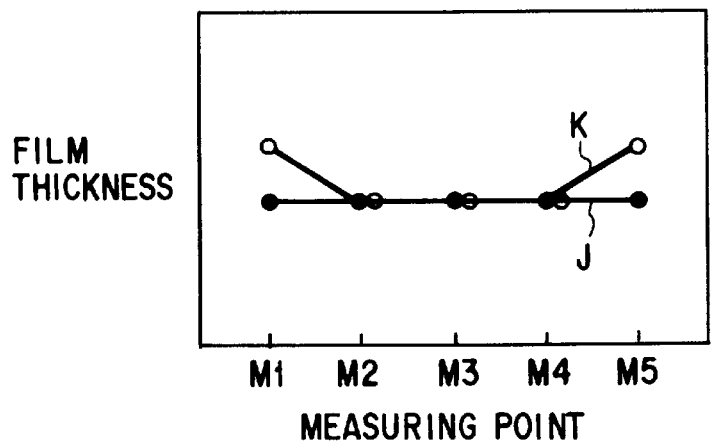
FIG. 9 is a profile showing the difference in thickness of the resist film formed on an LCD glass substrate depending upon positions thereof.

FIG. 9 shows differences in thickness of the resist film formed on the substrate G by plotting measuring point of the resist film on the abscissa and film thickness on the ordinate. To describe more specifically, the resist-film thickness was measured by Ellipso meter with respect to five points (M1 to M5) on the substrate G in the Y axis. In this figure, characteristic line J connecting solid-circles represents the differences in the film thickness formed by the apparatus of the present invention shown in FIG. 7. Characteristic line K connecting open-circles indicates the differences of the resist film coated by the conventional apparatus shown in FIG. 1. As is apparent from the figure, the resist film coated by the conventional apparatus is thicker in the peripheral measuring points (M1, M5) than the middle measuring points (M2 to M4), whereas no significant difference was observed between the peripheral measuring points (M1, M5) and the middle measuring points (M2 to M4) in the resist film of the present invention. It was thus clearly confirmed that the coating resist is formed in a uniform thickness over the entire surface of the substrate G when the apparatus of the present invention shown in FIG. 7 is used.

Next, we will explain the film thickness controlling means 40A of second embodiment with reference to FIG. 10. Note that explanation for the portions of second embodiment common to the first embodiment will be omitted.

The film thickness control means 40A of second embodiment has an ejector mechanism comprising a plurality of communicating paths 41, suction pipes 60, pressurized gas transmitting tubes 62, $N_2$ gas supply sources 63, drain tanks 64, and vacuum pumps 65. The suction pipe 60 has a reverse U shape. One end of the suction pipe 60 is connected to a communication path 41 and the other end (open end) is inserted into the drain tank 64. The uppermost portion (opening) 61 is connected to the pressurized gas transmitting tube 62. One end of the pressurized gas transmitting tube 62 is connected to the $N_2$ gas supply source 63. The other end is connected to a suction port of the vacuum pump 65.

When the $N_2$ gas is allowed to pass through the pressurized gas transmitting tube 62 and the tube 62 is then evacuated by the vacuum pump 65, the pressure of the suction pipe 60 is reduced through the opening 61. As a result, the resist solution is suctioned into the suction pipe 60 from both ends (in the longitudinal direction) of the liquid discharge port 21. The resist solution thus suctioned is collected in the drain tank 64. Since the resist solution present in the vicinity of the nozzle inner wall 20c of the liquid discharge port 21 is suctioned to remove, it is possible to reduce the discharge pressure of the resist solution form this region. As a result, the discharge pressure P2 of the resist solution discharged from the peripheral portion can be controlled to be equal to pressure 1 of that from the center portion. Therefore, the resist solution 50 can be supplied from the liquid discharge port 21 onto the substrate G in the form of a band having a uniform thickness, as shown in FIG. 8.

Next, we will explain the film-thickness control means 40B of third embodiment with reference to the FIG. 11. Note that explanation for the portions of third embodiment common to the first embodiment will be omitted.

The film thickness control means 40B of third embodiment comprises an air ventilation path 70 and an opening control valve mechanism 71. The lower end of the air ventilation path 70 is connected to a storage portion 22 at an intersection between the downwardly/ outwardly inclined inner wall 20b and the side inner wall 20c. The air ventilation path 70 and the side inner wall 20c are arranged in line along the Z-axis.

The opening control valve mechanism 71 has a main body 71a and a valve 71b. An entrance of the main body 71a is connected with the upper end of the air ventilation path 70. The outlet port of the main body 71a is communicated with the outer atmosphere. The valve 71b, is a liftable screw mechanism engaged with the main body 71a. The main body 71a is opened/shut by the valve 71b.

Since the discharge pressure P2 of the resist solution supplied from the both peripheral portions can be reduced by the film thickness control means 40B, discharge pressure P2 can be controlled to be equal to pressure P1 of the resist solution discharged from the center portion.

Now, the film thickness control means 40C of fourth embodiment will be explained with reference to FIGS. 12 and 13. Explanation for portions of fourth embodiment common to the first embodiment will be omitted.

The film thickness control means 40C of fourth embodiment comprises two heaters 80. Each heater 80 is provided on a side of the liquid discharge port 21 of the nozzle 20 via an insulation spacer 81. Note that the heater 80 may not always employ the insulation spacer 81 when it is provided on the nozzle 20. The heater 80 may be positioned at a small distance from the nozzle 20.

Figure 12:
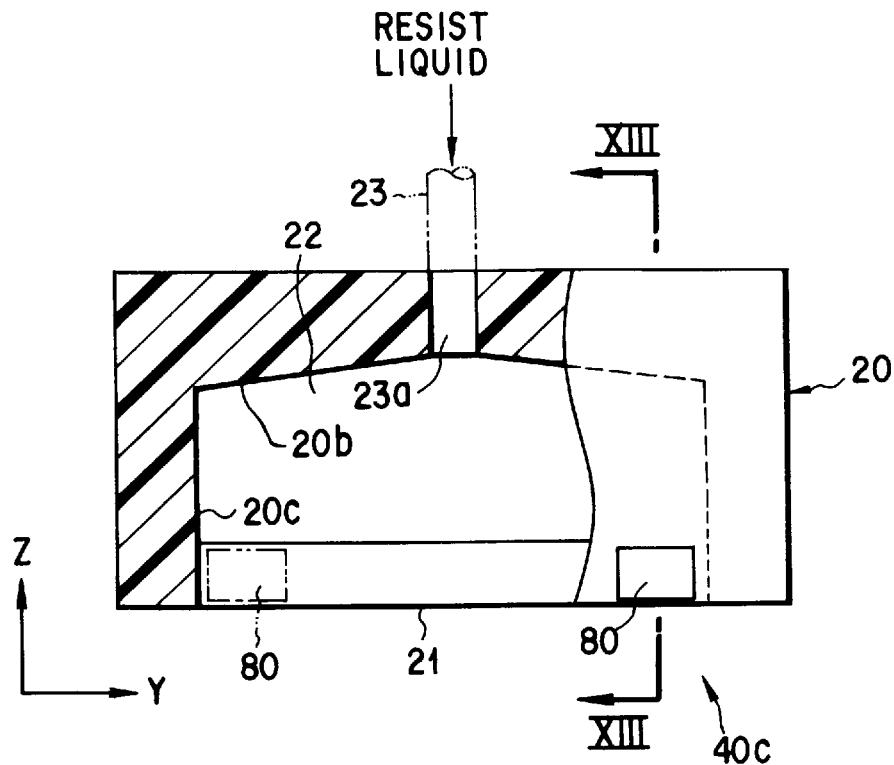
FIG. 12 is a cross-sectional view of a film-coating apparatus according to fourth embodiment of the present invention.

More specifically, the heater 80 is provided in the peripheral portion of the liquid discharge port 21 along the Y-axis, as shown in FIG. 12, and on the side of the nozzle 20 opposite to its moving direction (the X-axis), as shown in FIG. 13. A power source circuit of the heater 80 is connected to the output portion of the controller 171. The insulation spacer 81 is made of a resin having a small thermal conductivity or a plastic. The reason why the heater 80 is provided on the nozzle 20 via the spacer 81 is that if heat is directly transmitted from the heater 80 to the nozzle, viscosity of the resist solution 50 present at the liquid discharge port 21 is changed due to local temperature increase. By virtue of this arrangement of the heater, it is possible to minimize thermal influence upon the resist solution 50 present at the liquid discharge port 21. On the other hand, the resist solution 50 is heated immediately upon supply onto the substrate G. As a result, the resist film can be formed on the substrate G in a uniform thickness. To describe more precisely, the resist solution 50 discharged from the both ends (in the longitudinal direction) of the liquid discharge port 21 can be reduced in flow rate (to increase flow resistance) since the viscosity is increased by the heater. Therefore, the flow rate (flow resistance) of the resist solution 50 discharged from the peripheral portion can be controlled to be equal to the flow rate of that from the center portion of the liquid discharge port 21.

In fourth embodiment, the viscosity of the resist solution 50 is controlled in consideration of the facts that the viscosity of the resist solution 50 varies depending upon the pressure between the end portions (in the longitudinal direction) and the center portion of the liquid discharge port 21 and depending upon the influence of ambient temperature and static electricity immediately upon the supply on the substrate G. In this manner, the film thickness of the coating resist can be controlled uniform. Since a solvent (thinner) 50A contained in the resist solution 50 supplied on the substrate G can be volatilized by the heater 80, the dehydration of the resist solution 50 can be accelerated, reducing the resist film formation time. Consequently, the throughput is further improved.

In the aforementioned embodiments, the nozzle 20 is moved. However, the mounting table 10 may be moved relative to a fixed nozzle. Alternatively, both nozzle 20 and mounting table 10 may be moved.

In the aforementioned embodiments, the mounting table 10 has a vacuum suction mechanism for holding the substrate. However, as the substrate holding means, a plurality of rollers arranged in line may be used.

The film coating apparatus constructed as described above may be used alone as a resist film coating apparatus for an LCD substrate or used by being installed in a resist coating/ developing process system. Hereinbelow, we will explain the resist coating/developing process system with the aforementioned film coating apparatus installed therein.

Figure 14:
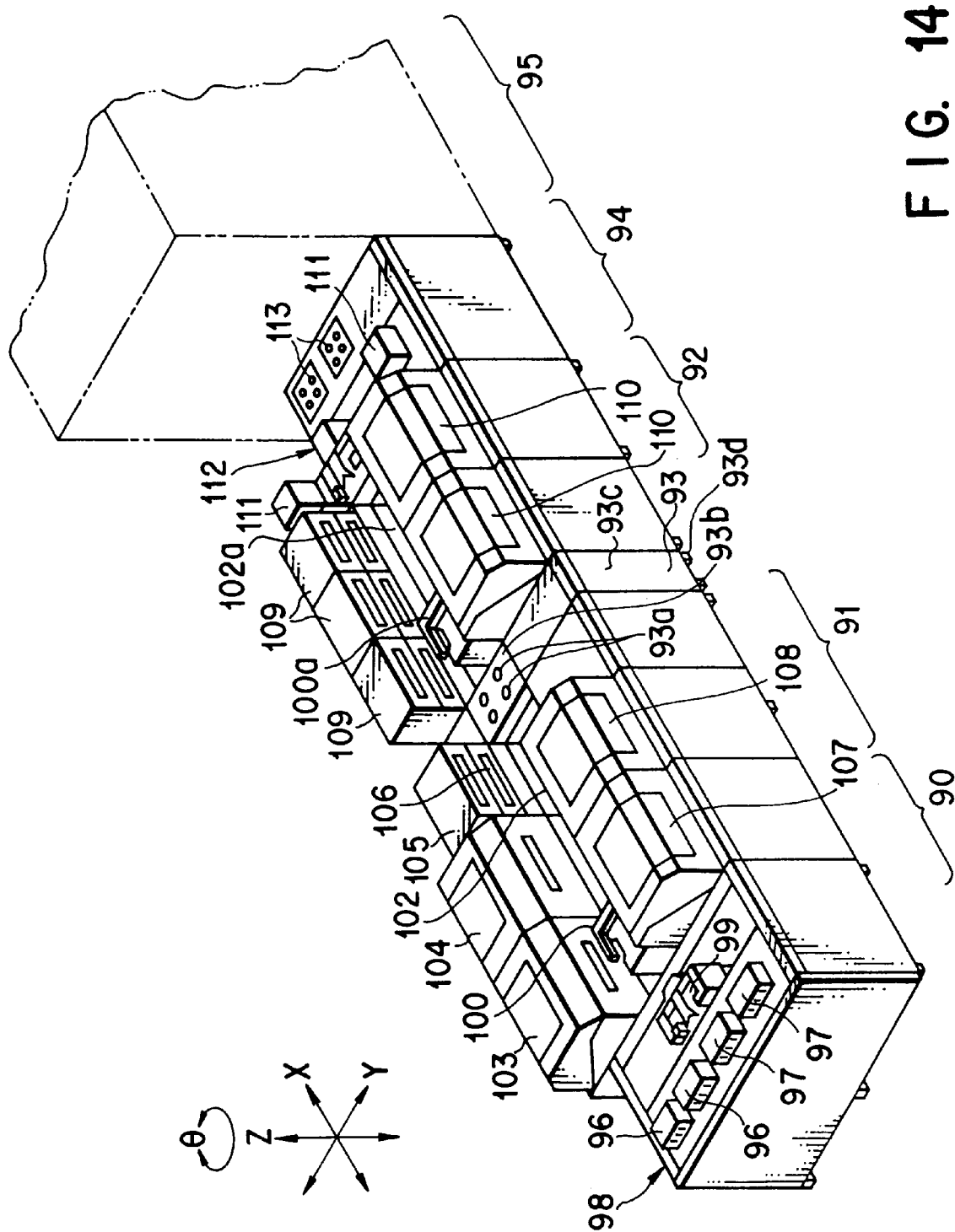
FIG. 14 is a schematic perspective view of a coating/developing process system having a film-coating apparatus.

As shown in FIG. 14, the resist coating/developing process system comprises a loader portion 90, two sub-arm mechanisms 99, 112, two main arm mechanisms 100, 100a, a first process section 91, a second process section 92, and an intermediate relay section 93. Note that a light-exposure device 95 for irradiating the coating resist, may be connected to the second process section 92 via the transfer portion 94.

Now, we will explain the case where an LCD substrate G is processed by using the resist coating/developing process system. The LCD substrate G is taken out form the cassette 96 by the sub-arm mechanism 99, transferred to the main arm mechanism 100 and loaded in the first process section 91. The substrate G is scrub-washed in the brush washing device 103 and washed with high-pressure jet water in a jet water washing device 14. The substrate G is further subjected to an adhesion process performed in an adhesion process device 105. After the substrate G is cooled in the cool process device 106, the resist coating is carried out in the film coating device 107. Subsequently, unnecessary resist film is removed from the peripheral portion of the substrate G in the coating-film removing device 108. The substrate G is then baked with heat in the heat process device 109, transferred by the main arm 100a to the transfer mounting table 113, and then transferred by the second sub-arm mechanism 112 from the transfer table 113 to the light-exposure device 95. After the light-exposure process is completed in the light-exposure device 95, the substrate G is developed in the development device 110 and rinsed with pure water. In this manner, the developing process is completed.

The LCD substrates G to which a series of process treatments have been applied, are stored in a cassette 97 at the loader portion 90. The cassette 97 storing the substrates G is unloaded out of the system.

In the aforementioned embodiments, the film-coating apparatus according to the present invention is applied to the resist coating apparatus for an LCD substrate. The apparatus of the present invention may be applied to a film-coating apparatus for a semi-conductor wafer and CD other than the LCD substrate or applied to an apparatus for coating a green film on an electric board. In the apparatus of the present invention, a polyimide based coating solution (PIQ) and a coating solution containing a glass ingredient (SOG) may be used other than the resist.

The present invention makes it possible to reduce the pressure of the coating solution discharged from the both peripheral region of the slit-form discharge port to the equal pressure as that of the coating solution discharged from the other portion of the discharge port. Therefore, the discharge pressure of the coating solution can be rendered uniform over the port, thereby supplying the coating solution in the form of a uniform band. Consequently, the resultant coating film is formed in a uniform thickness over the substrate surface and the product yield can be improved.

Furthermore, the present invention makes it possible to increase the viscosity of the coating solution discharged from both sides of the slit-form discharge port in the longitudinal direction, thereby reducing the flow rate thereof. Therefore, the flow rate of the coating solution discharged from both peripheral regions of the discharge port can be made equal to that from the middle region of the discharge port. As a result, the coating solution is discharged at a uniform flow rate in the form of a band to form a coating film over the entire substrate in a uniform thickness. The yield can be thus improved. In addition, the coating solution can be accelerated to dry by volatilizing a solvent contained in the coating solution by dehydration means. Hence, the coating film formation time can be shortened and the improvement of the throughput can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A film coating apparatus comprising:
   a substrate holding mechanism configured to hold a substrate substantially horizontally;
   a nozzle having a slit-form liquid discharge port extending from one end to another end of the substrate;
   a coating solution supply mechanism in fluid communication with said nozzle and configured to supply a coating solution to the nozzle; and
   a moving mechanism coupled to said nozzle and configured to move the nozzle in parallel to an upper surface of the substrate in a direction perpendicular to a longitudinal direction of the slit-form liquid discharge port in such a manner that the slit-form liquid discharge port keeps a substantially constant clearance with the substrate,
   the nozzle comprising:
      an inlet port for introducing the coating solution from the coating solution supply mechanism;
      a liquid storage portion communicating with both the inlet port and the slit-form liquid discharge port, said liquid storage portion being configured to temporarily store the coating solution introduced through the inlet port; and
      a film-thickness control mechanism provided on both peripheral regions of the slit-form liquid discharge port, said film-thickness control mechanism being configured to reduce a pressure of the coating solution discharged from two peripheral regions of the slit-form liquid discharge port;
      wherein the film-thickness control mechanism controls the pressure of the coating solution discharged from the two peripheral regions of the slit-form liquid discharge port to be substantially equal to a pressure at a middle region of said slit-form liquid discharge port, thereby forming a coating film with a uniform thickness on an upper surface of the substrate.

2. The apparatus according to claim 1, wherein the liquid storage portion comprises:
   a short side face defined by a downwardly/outwardly inclined inner wall and a first vertical inner wall;
   a long side face defined by a second vertical inner wall, a downwardly/outwardly inclined inner wall, and a third vertical inner wall; and
   wherein the first vertical inner wall defines the two peripheral regions of the slit-form liquid discharge port.

3. The apparatus according to claim 2, wherein a side in a direction parallel to the longitudinal direction of the slit-form liquid discharge port of the downwardly/outwardly inclined inner wall of the liquid storage portion is widened downwardly outward.

4. The apparatus according to claim 2 wherein a side in a direction perpendicular to the longitudinal direction of the slit-form liquid discharge port of the downwardly/inwardly inclined inner wall of the liquid storage portion is reduced downwardly inward.

5. The apparatus according to claim 2, wherein the film-thickness control mechanism comprises:

a plurality of communication paths each having an opening end in the first vertical inner wall, a plurality of suction pipes connected to the communication paths, and vacuum pumps for evacuating the suction pipes.

6. The apparatus according to claim 2, wherein the film-thickness control mechanism comprises:

a plurality of communication paths each having an opening end in the first vertical inner wall, suction pipes respectively communicating with the communication paths, and ejector mechanisms configured to reduce a pressure in the suction pipes.

7. The apparatus according to claim 2, wherein the film-thickness control mechanism comprises:

a plurality of air ventilation paths each having an opening between the downwardly/outwardly inclined inner wall and the first vertical inner wall, and opening controlling valves for opening/closing the air ventilation path, the pressure of the coating solution discharged from the two peripheral regions of the slit-form liquid discharge port being reduced when the opening controlling valves are opened to communicate the air ventilation path with air.

8. The apparatus according to claim 1, further comprising a heater positioned at a lower side portion of said nozzle and configured to heat the coating solution discharged onto the substrate from the two peripheral regions of the liquid discharge port.

9. The apparatus according to claim 8, further comprising an insulating spacer positioned between said heater and said lower portion of the nozzle.

10. The apparatus according to claim 1, further comprising a dehydration mechanism configured to volatize a solvent contained in the coating solution upon supply from the two peripheral regions of the slit-form liquid discharge port, thereby increasing the viscosity of the coating solution.

11. The apparatus according to claim 1, wherein said nozzle at least has a liquid discharge port made of a resin.

12. The apparatus according to claim 1, wherein said substrate holding mechanism is configured to hold a rectangular glass substrate for LCD and said coating solution supply mechanism is configured to supply a photoresist solution.

13. The apparatus according to claim 1, wherein the nozzle is a linear nozzle.

14. The apparatus according to claim 1, wherein a width of said liquid storage portion is wider than a width of said slit-form liquid discharge port.

* * * * *